(12) United States Patent
Xie et al.

(10) Patent No.: US 8,657,961 B2
(45) Date of Patent: Feb. 25, 2014

(54) METHOD FOR UV BASED SILYLATION CHAMBER CLEAN

(71) Applicant: Applied Materials, Inc., Santa Clara, CA (US)

(72) Inventors: Bo Xie, San Jose, CA (US); Alexandros T. Demos, Fremont, CA (US); Scott A. Hendrickson, Brentwood, CA (US); Sanjeev Baluja, Campbell, CA (US); Juan Carlos Rocha-Alvarez, San Carlos, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 13/856,962

(22) Filed: Apr. 4, 2013

(65) Prior Publication Data

US 2013/0284204 A1 Oct. 31, 2013

Related U.S. Application Data

(60) Provisional application No. 61/638,421, filed on Apr. 25, 2012.

(51) Int. Cl.
*C25F 1/00* (2006.01)

(52) U.S. Cl.
USPC .................. 134/1.1; 134/1; 134/1.2; 134/1.3; 134/8; 134/21; 134/22.1; 134/31; 134/37; 134/42; 134/902; 216/21; 216/55; 430/311; 430/328; 430/330; 438/4; 438/706; 438/710; 438/715; 438/725; 438/781; 438/783; 438/795; 438/799; 438/800; 438/905

(58) Field of Classification Search
USPC ............. 438/4, 706, 710, 715, 725, 781, 783, 438/795, 799, 800, 905; 430/311, 328, 330; 216/21, 55; 134/1, 1.1, 1.2, 1.3, 8, 21, 134/22.1, 31, 37, 42, 902
See application file for complete search history.

(56) References Cited

U.S. PATENT DOCUMENTS

| 2004/0154743 A1* | 8/2004 | Savas et al. ................. 156/345.5 |
| 2006/0249175 A1* | 11/2006 | Nowak et al. ...................... 134/1 |
| 2006/0251827 A1* | 11/2006 | Nowak et al. .................. 427/558 |
| 2013/0177706 A1* | 7/2013 | Baluja et al. ................... 427/226 |

FOREIGN PATENT DOCUMENTS

| JP | 2009-004104 | 1/2009 |
| KR | 10-2003-0030626 | 4/2003 |
| KR | 10-2008-0026069 | 3/2008 |
| KR | 10-2008-0026746 | 3/2008 |
| KR | 10-2001-0066360 | 7/2011 |

OTHER PUBLICATIONS

International Search Report and Written Opinion of the International Searching Authority mailed Jul. 23, 2013 in PCT/US13/035297.

* cited by examiner

*Primary Examiner* — Bibi Carrillo
(74) *Attorney, Agent, or Firm* — Patterson & Sheridan, LLP

(57) ABSTRACT

Embodiments of the invention generally provide methods for cleaning a UV processing chamber. In one embodiment, the method includes flowing an oxygen-containing gas through a plurality of passages formed in a UV transparent gas distribution showerhead and into a processing region located between the UV transparent gas distribution showerhead and a substrate support disposed within the thermal processing chamber, exposing the oxygen-containing gas to UV radiation under a pressure scheme comprising a low pressure stage and a high pressure stage to generate reactive oxygen radicals, and removing unwanted residues or deposition build-up from exposed surfaces of chamber components presented in the thermal processing chamber using the reactive oxygen radicals.

16 Claims, 4 Drawing Sheets

METHOD FOR UV BASED SILYLATION CHAMBER CLEAN

CROSS-REFERENCE TO RELATED APPLICATIONS

This application claims benefit of U.S. provisional patent application Ser. No. 61/638,421, filed Apr. 25, 2012, which is herein incorporated by reference.

BACKGROUND OF THE INVENTION

1. Field of the Invention

Embodiments of the invention relate to methods for cleaning optical components within a processing chamber.

2. Description of the Related Art

Semiconductor devices include metal layers that are insulated from each other by dielectric layers. As device features shrink, reducing the distance between the metal layers and between metal lines on each layer, capacitance increases. To address this problem, new insulating materials that have a relatively low dielectric constant are being used in place of silicon dioxide to form the dielectric layer that separates the metal lines. An exemplary material that may be used to form such a low-k dielectric layer is porous carbon doped oxide (CDO). Using this material instead of silicon dioxide to separate metal lines can yield a device having reduced propagation delay, cross-talk noise and power dissipation.

Porous carbon-doped oxides achieve lower dielectric constants through the incorporation of non-polar covalent bonds (e.g., from the addition of carbon) and the introduction of porosity to decrease film density. Introducing porosity or the incorporation of terminal bonds, such as Si—$CH_3$, breaks the continuity of the rigid Si—O—Si lattice of oxides, yielding a lower dielectric constant film that is both mechanically and chemically weaker. Because of the mechanical weakness, porous carbon-doped oxides are susceptible to damages caused by plasma etching and ashing processes that are known to lead to subsequent moisture uptake which detrimentally increase the dielectric constant to unacceptable levels. Therefore, a k-restoration process, such as a silylation process, is typically performed to repair at least some of the damage to the porous carbon-doped oxides.

The silylation process repairs the damage by replacing hydrophilic bonds with hydrophobic bonds. For example, a silylating agent such as methyl or phenyl containing compounds may be introduced into a chamber to react with the Si—OH groups in low-k films to convert the hydrophilic Si—OH groups into hydrophobic groups to reduce moisture uptake, thus decreasing dielectric constant. A UV (ultra violet) curing process may be optionally performed in-situ or in a separate chamber to accelerate the reaction and/or seal pores in the low-k films.

During the silylation process, various exposed surfaces of the chamber components, such as the quartz based vacuum window, showerhead, and chamber walls etc., presented in the chamber can become coated with repairing chemicals, resulting in degradation of the UV source efficiency or particle contamination of the substrate during subsequent processing. The build-up of these silylation coating or residues on the chamber components requires periodic cleaning, which results in significant tool downtime and a corresponding reduction in throughput.

Therefore, a need exists to clean silylation residues on the chamber components and increase UV efficiency.

SUMMARY OF THE INVENTION

Embodiments of the invention generally provide methods for removing silylation residues on exposed surfaces of the chamber components (such as chamber walls, optical components, and substrate support) disposed within a UV processing chamber. Particularly, the chamber components are efficiently cleaned with a cleaning process comprised of a low-pressure ozone clean and a high-pressure ozone clean.

In one embodiment, the method for cleaning a thermal processing chamber is provided. The method includes flowing an oxygen-containing gas through a plurality of passages formed in a UV transparent gas distribution showerhead and into a processing region located between the UV transparent gas distribution showerhead and a substrate support disposed within the thermal processing chamber, exposing the oxygen-containing gas to UV radiation under a pressure scheme comprising a low pressure stage and a high pressure stage to generate reactive oxygen radicals, and removing unwanted residues or deposition build-up from exposed surfaces of chamber components presented in the thermal processing chamber using the reactive oxygen radicals. In one example, the low pressure stage includes maintaining a total chamber pressure at a range between about 500 milliTorr and about 20 Torr for about 15 seconds to about 5 minutes, and the high pressure stage includes maintaining a total chamber pressure at a range between about 30 Torr and about 200 Torr for about 15 seconds to about 5 minutes.

In another embodiment, a method for cleaning a thermal processing chamber is provided. The method includes transferring a substrate out of the thermal processing chamber, introducing an oxygen-containing gas into an upper processing region of the thermal processing chamber, the upper processing region located between a transparent window and a transparent showerhead positioned within the thermal processing chamber, flowing the oxygen-containing gas through one or more passages formed in the transparent showerhead and into a lower processing region, the lower processing region located between the transparent showerhead and a substrate support located within the thermal processing chamber, exposing the oxygen-containing gas to a thermal radiation to generate reactive oxygen radicals, and removing unwanted residues or deposition build-up from exposed surfaces of chamber components presented in the thermal processing chamber using the reactive oxygen radicals. The method further includes exposing the oxygen-containing gas to the thermal radiation under a pressure scheme comprising a low pressure stage and a high pressure stage. In one example, the low pressure stage includes maintaining a total chamber pressure at a range between about 500 milliTorr and about 20 Torr for a first period of time, and the high pressure stage includes maintaining a total chamber pressure at a range between about 30 Torr and about 200 Torr for a second period of time.

In yet another embodiment, a method for cleaning a thermal processing chamber is provided. The method includes providing a substrate on a substrate support disposed in a processing region of the thermal processing chamber, wherein the thermal processing chamber comprises a UV transparent gas distribution showerhead disposed above the substrate support, the UV transparent gas distribution showerhead has a plurality of passages formed in the UV transparent gas distribution showerhead, a UV transparent window disposed above the UV transparent gas distribution showerhead, and a UV unit disposed outside the processing region, wherein the UV unit is configured to direct a UV radiation towards the substrate support through the UV transparent window and the UV transparent gas distribution showerhead, chemically treating the substrate by flowing one or more processing gases into the processing region through the plurality of passages formed in the UV transparent gas distribution showerhead, curing the substrate by directing the UV radiation towards the substrate from the UV unit through the UV transparent gas distribution showerhead and the UV transparent window, transferring the substrate out of the thermal processing chamber, flowing an oxygen-containing gas through the plurality of passages formed in the UV transparent gas distribution showerhead and into the processing region, exposing the oxygen-containing gas to the UV radiation from the UV unit under a pressure scheme comprising a low pressure stage and a high pressure stage to generate reactive oxygen radicals, and removing unwanted residues or deposition build-up from exposed surfaces of chamber components presented in the thermal processing chamber using the reactive oxygen radicals. In one example, the low pressure stage includes maintaining a total chamber pressure at a range between about 500 milliTorr and about 20 Torr for about 15 seconds to about 5 minutes, and the high pressure stage includes maintaining a total chamber pressure at a range between about 30 Torr and about 200 Torr for about 15 seconds to about 5 minutes.

BRIEF DESCRIPTION OF THE DRAWINGS

So that the manner in which the above-recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Figure 1:
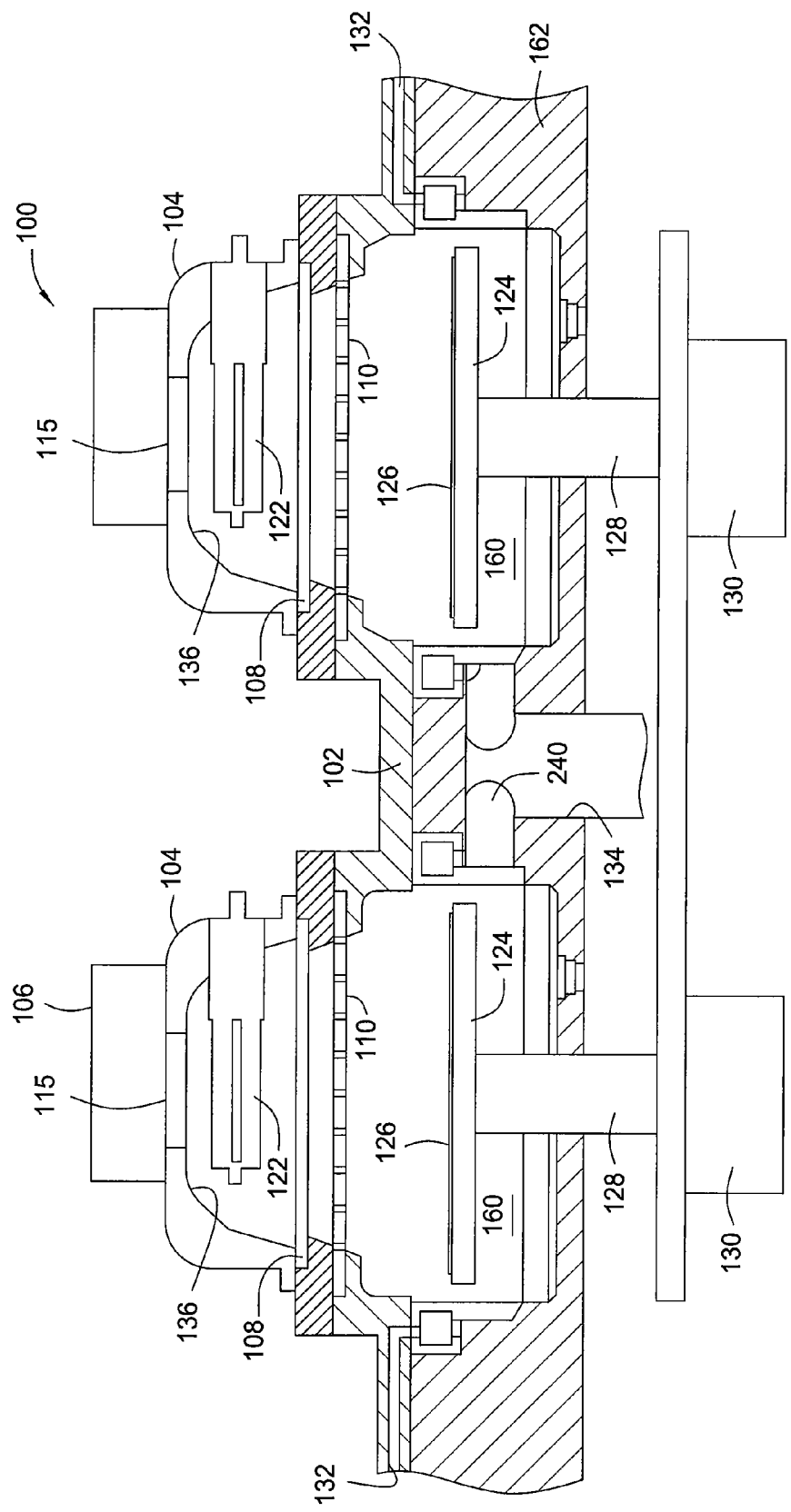
FIG. 1 is a partial cross-sectional section view of a tandem processing chamber that has a lid assembly with two UV bulbs disposed respectively above two processing regions.

FIG. 1 illustrates a cross-sectional view of an exemplary tandem processing chamber 100 that benefits the present invention. The processing chamber 100 provides two separate and adjacent processing regions in a chamber body for processing the substrates. The processing chamber 100 has a lid 102, housings 104 and power sources 106. Each of the housings 104 cover a respective one of two UV lamp bulbs 122 disposed respectively above two processing regions 160 defined within the body 162. Each of the processing regions 160 includes a heating substrate support, such as substrate support 124, for supporting a substrate 126 within the processing regions 160. The UV lamp bulbs 122 emit UV light that is directed through the windows 108 and showerheads 110 onto each substrate located within each processing region. The substrate supports 124 can be made from ceramic or metal such as aluminum. The substrate supports 124 may couple to stems 128 that extend through a bottom of the body 162 and are operated by drive systems 130 to move the substrate supports 124 in the processing regions 160 toward and away from the UV lamp bulbs 122. The drive systems 130 can also rotate and/or translate the substrate supports 124 during curing to further enhance uniformity of substrate illumination. The exemplary tandem processing chamber 100 may be incorporated into a processing system, such as a Producer™ processing system, commercially available from Applied Materials, Inc., of Santa Clara, Calif.

The UV lamp bulbs 122 can be an array of light emitting diodes or bulbs utilizing any of the state of the art UV illumination sources including, but not limited to, microwave arcs, radio frequency filament (capacitively coupled plasma) and inductively coupled plasma (ICP) lamps. The UV light can be pulsed during a cure process. Various concepts for enhancing uniformity of substrate illumination include use of lamp arrays which can also be used to vary wavelength distribution of incident light, relative motion of the substrate and lamp head including rotation and periodic translation (sweeping), and real-time modification of lamp reflector shape and/or position. The UV bulbs are a source of ultraviolet radiation, and may transmit a broad spectral range of wavelengths of UV and infrared (IR) radiation.

The UV lamp bulbs 122 may emit light across a broad band of wavelengths from 170 nm to 400 nm. The gases selected for use within the UV lamp bulbs 122 can determine the wavelengths emitted. UV light emitted from the UV lamp bulbs 122 enters the processing regions 160 by passing through windows 108 and gas distribution showerheads 110 disposed in apertures in the lid 102. The windows 108 may be made of an OH free synthetic quartz glass and have sufficient thickness to maintain vacuum without cracking. The windows 108 may be fused silica that transmits UV light down to approximately 150 nm. The showerheads 110 may be made of transparent materials such as quartz or sapphire and positioned between the windows 108 and the substrate support 124. Since the lid 102 seals to the body 162 and the windows 108 are sealed to the lid 102, the processing regions 160 provide volumes capable of maintaining pressures from approximately 1 Torr to approximately 650 Torr. Processing or cleaning gases may enter the processing regions 160 via a respective one of two inlet passages 132. The processing or cleaning gases then exit the processing regions 160 via a common outlet port 134.

Each of the housings 104 includes an aperture 115 adjacent the power sources 106. The housings 104 may include an interior parabolic surface defined by a cast quartz lining 136 coated with a dichroic film. The dichroic film usually constitutes a periodic multilayer film composed of diverse dielectric materials having alternating high and low refractive index. Therefore, the quartz linings 136 may transmit infrared light and reflect UV light emitted from the UV lamp bulbs 122. The quartz linings 136 may adjust to better suit each process or task by moving and changing the shape of the interior parabolic surface.

Figure 2:
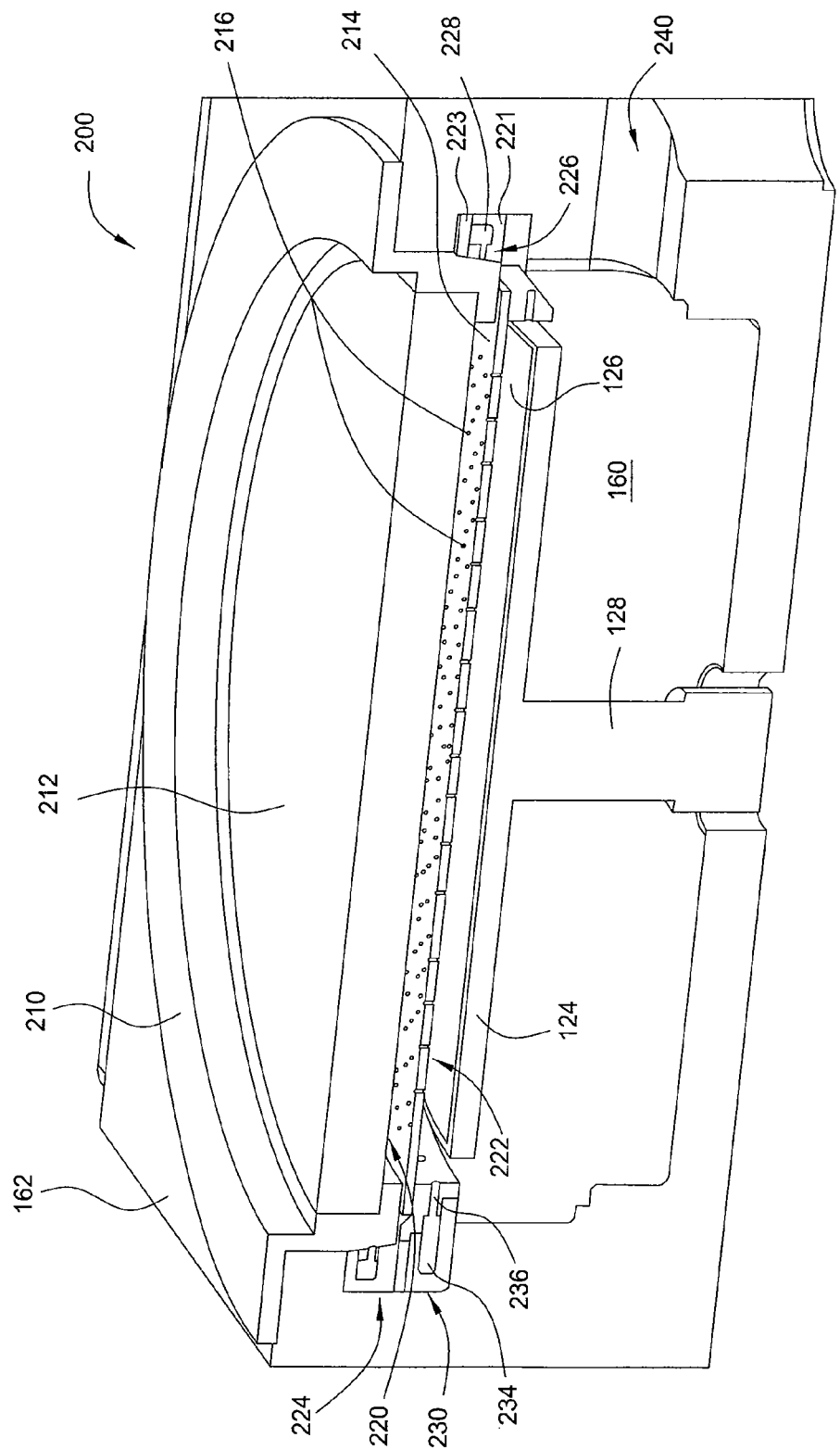
FIG. 2 is a schematic isometric cross-sectional view of a portion of one of the processing chambers without the lid assembly.

FIG. 2 shows a schematic isometric cross-sectional view of a portion of one of the processing chambers 200, which may be used alone, or in place of any of the processing region of the tandem processing chamber 100. The design of hardware shown in FIG. 2 enables a specific gas flow profile distribution across the substrate 126 being processed in a UV chamber, lamp heated chamber, or other chamber where light energy is used to process a film or catalyze a reaction, either directly on or above the substrate 126.

A window assembly is positioned within the processing chamber 200 to hold a first window, such as a UV vacuum window 212. The window assembly includes a vacuum window clamp 210 that may be directly or indirectly rested on a portion of the body 162 (FIG. 1) and supports a vacuum window 212 through which UV light may pass from the UV lamp bulbs 122. The vacuum window 212 is generally positioned between the UV radiation source, such as UV lamp bulbs 122, and the substrate support 124. A showerhead 214, which may be formed of various transparent materials such as quartz or sapphire, is positioned within the processing region 160 and between the vacuum window 212 and the substrate support 124. The transparent showerhead 214 forms a second window through which UV light may pass to reach the substrate 126. The transparent showerhead defines an upper processing region 220 between the vacuum window 212 and transparent showerhead 214 and further defines a lower processing region 222 between the transparent showerhead 214 and the substrate support, such as substrate support 124. The transparent showerhead 214 also has one or more passages 216 between the upper and lower processing regions 220, 222. The passages 216 may have a roughened internal surface for diffusing the UV light so there is no light pattern on the substrate 126 during processing. The size and density of the passages 216 may be uniform or non-uniform to effectuate the desired flow characteristics across the substrate surface. The passages 216 may have either a uniform flow profile where the flow per radial area across the substrate 126 is uniform or the gas flow can be preferential to the center or edge of the substrate 126, i.e. the gas flow may have a preferential flow profile.

The front and/or back surface of the transparent showerhead 214 and vacuum window 212 may be coated to have a band pass filter and to improve transmission of the desired wavelengths or improve irradiance profile of the substrate. For example, an anti-reflective coating (ARC) layer may be deposited on the transparent showerhead 214 and vacuum window 212 to improve the transmission efficiency of desired wavelengths. The ARC layer may be deposited in a way that the thickness of the reflective coating at the edge is relatively thicker than at the center region of the transparent showerhead 214 and vacuum window 212 in a radial direction, such that the periphery of the substrate disposed underneath the vacuum windows 212 and the transparent showerhead 214 receives higher UV irradiance than the center. The ARC coating may be a composite layer having one or more layers formed on the surfaces of the vacuum window 212 and transparent showerhead 214. The compositions and thickness of the reflective coating may be tailored based on the incidence angle of the UV radiation, wavelength, and/or the irradiance intensity. A more detailed description/benefits of the ARC layer is further described in the commonly assigned U.S. patent application Ser. No. 13/301,558 filed on Nov. 21, 2011 by Baluja et al., which is incorporated by reference in its entirety.

A gas distribution ring 224 made of aluminum oxide is positioned within the processing region 160 proximate to the sidewall of the UV chamber. The gas distribution ring 224 can be a single piece, or can include a gas inlet ring 223 and a base distribution ring 221 having one or more gas distribution ring passages 226. The gas distribution ring 224 is configured to generally surround the circumference of the vacuum window 212. The gas inlet ring 223 may be coupled with the base distribution ring 221 which together may define the gas distribution ring inner channel 228. A gas supply source 242 (FIG. 3) is coupled to one or more gas inlets (not shown) formed in a surface of the gas inlet ring 223 through which gas may enter the gas distribution ring inner channel 228. The one or more gas distribution ring passages 226 couple the gas distribution ring inner channel 228 with the upper processing region 220, forming a gas flow path between the inner channel 228 and the upper processing region 220 above the transparent showerhead 214.

A gas outlet ring 230 is positioned below the gas distribution ring 224 and may be at least partially below the transparent showerhead 214 within the processing region 160. The gas outlet ring 230 is configured to surround the circumference of the transparent showerhead 214 and having one or more gas outlet passages 236 coupling a gas outlet ring inner channel 234 and the lower processing region 222, forming a gas flow path between the lower processing region 222 and the gas outlet inner channel 234. The one or more gas outlet passages 236 of the gas outlet ring 230 are disposed at least partially below the transparent showerhead 214.

Figure 3:
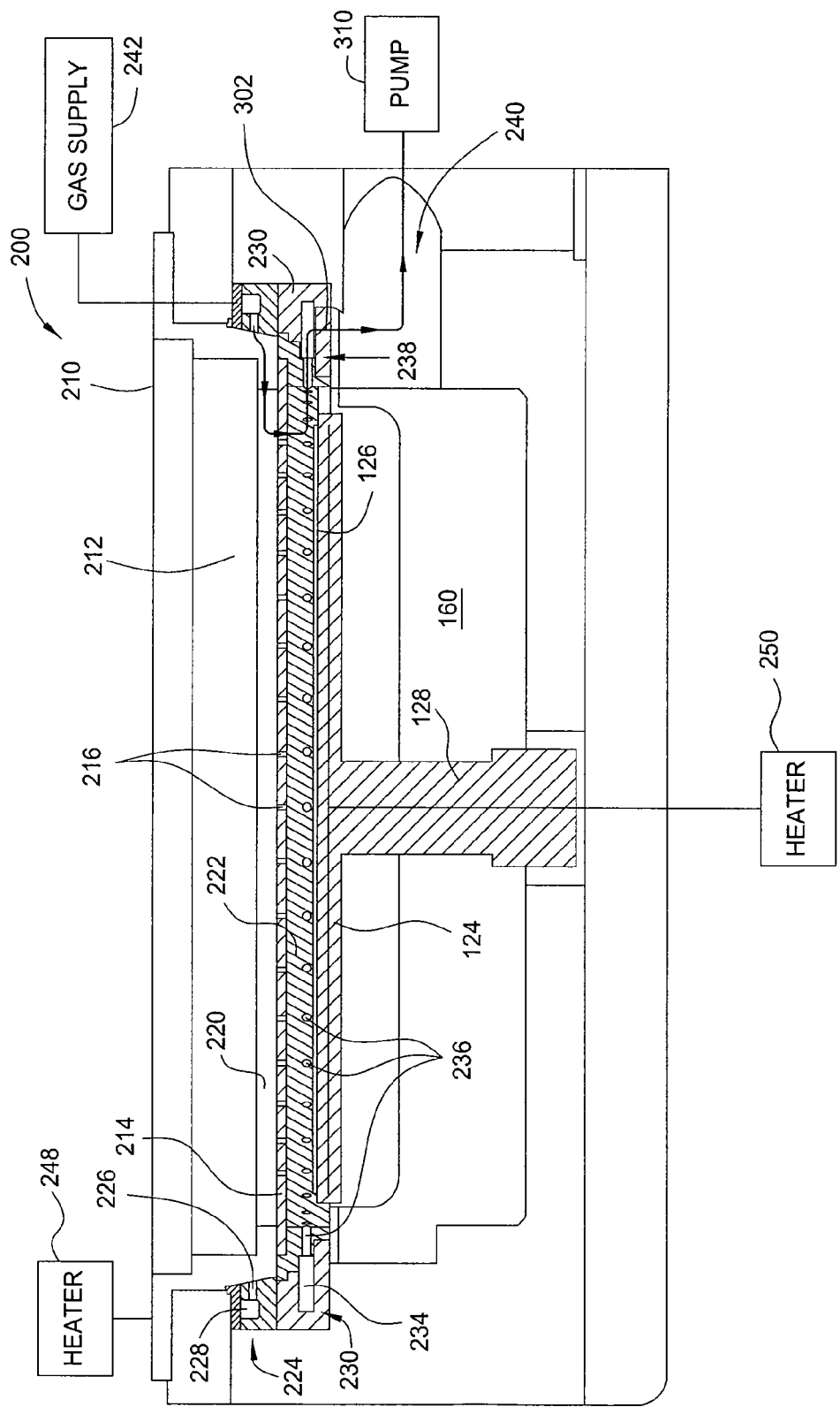
FIG. 3 is a schematic cross-sectional view of the processing chamber in FIG. 2 illustrating a gas flow path.

FIG. 3 depicts a schematic cross-sectional view of the processing chamber 200 in FIG. 2 illustrating a gas flow path. As indicated by arrow 302, a processing gas such as carbon-based precursor, silicon-based precursor, silylating agent, or other types of gases may be injected into and evenly filled the upper processing region 220 between the vacuum window 212 and the transparent showerhead 214, through the transparent showerhead 214, over the substrate support 124 which may have a substrate 126 disposed thereon, down towards the substrate from the transparent showerhead 214. The gas flow washes over the substrate 126 from above, spreads out concentrically, and exits the lower processing region 222 through gas outlet passages 236. The gas then is ejected from the lower processing region 222, enters the gas outlet ring inner channel 234, and exits the gas outlet 238 into a gas exhaust port 240 and to a pump 310. Depending on the pattern of the passages 216 in the showerhead 214, the gas flow profile may be controlled across the substrate 126 to provide a desired uniform or non-uniform distribution. The processing chamber 200 is further described in the commonly assigned U.S. patent application Ser. No. 13/248,656 filed on Sep. 29, 2011 by Baluja et al., which is incorporated by reference in its entirety.

Exemplary Cleaning Process

Figure 4:
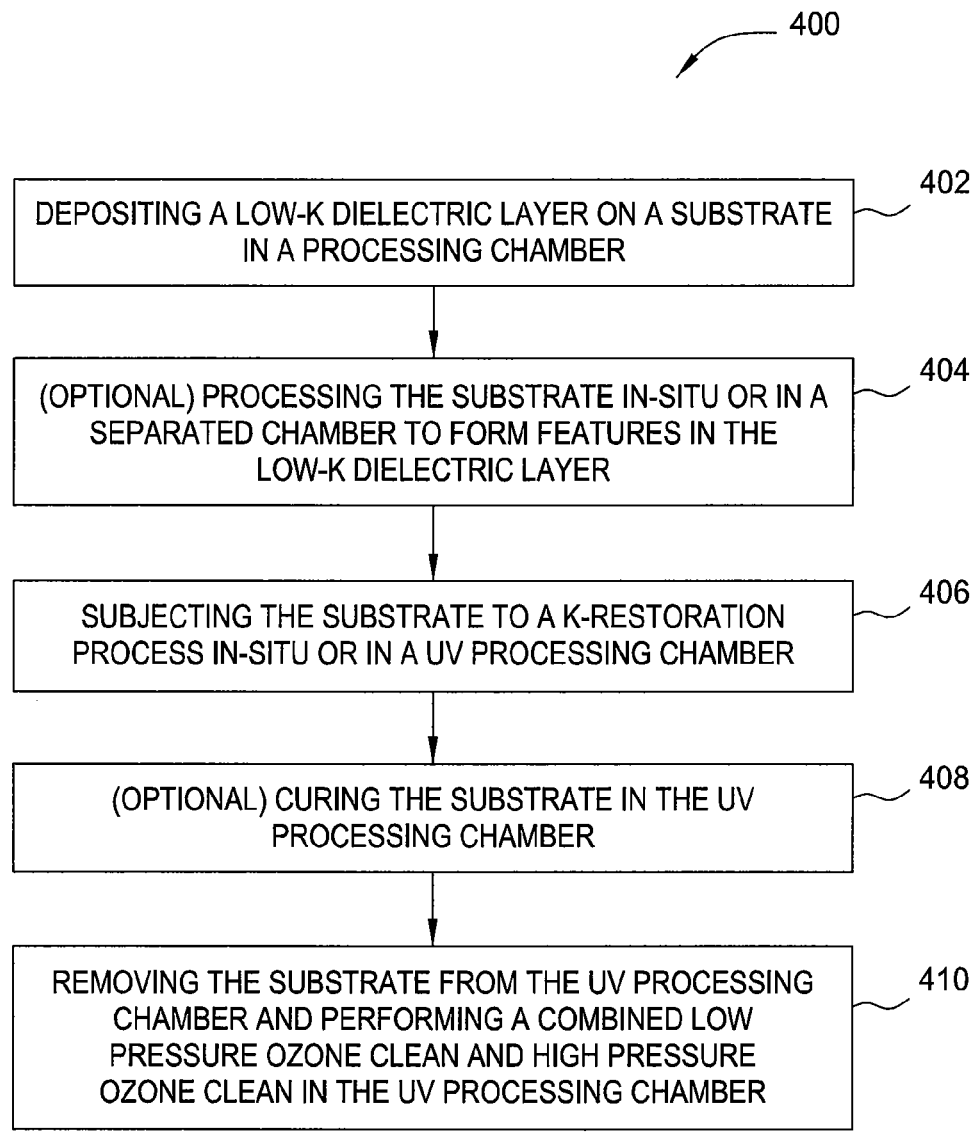
FIG. 4 is an exemplary process sequence for cleaning exposed surfaces of chamber components within a UV processing chamber in accordance with one embodiment of the present invention.

FIG. 4 illustrates an exemplary process 400 for removing silylation residues or other unwanted deposition build-up from exposed surfaces of chamber components disposed within a UV processing chamber in accordance with one embodiment of the present invention. The UV processing chamber may be any UV-based chamber such as the processing chambers 100, 200 shown in FIGS. 1 and 2. It should be noted that the sequence of steps illustrated in FIG. 4 are not intended to be limiting as to the scope of the invention described herein, since one or more steps may be added, deleted and/or reordered without deviating from the basic scope of the invention.

The process 400 starts with step 402 by depositing a low-k dielectric layer on a substrate in a processing chamber. The low-k dielectric layer may be any conventional porous, low-k, silicon based dielectric material having a k value below about 3. In one embodiment, the low-k dielectric layer is an organosilicate glass (OSG, also known as SiCOH) which is a silicon oxide contains carbon and hydrogen atoms. SiCOH may have a k value between about 2 and 3 and is available as Black Diamond II™ from Applied Materials. The low-k dielectric layer may have micro pores having diameters in the range of about 0.5 nm to about 20 nm. The low-k dielectric layer may be deposited by a plasma-enhanced chemical vapor deposition (PECVD) or any other suitable deposition technique.

In step 404, the substrate may be optionally processed in-situ or in a separated processing chamber to form features, such as vias and/or trenches, in the low-k dielectric layer using any suitable dry or wet etching process. Any masking materials and/or residues from the etching process which are left on the substrate may be stripped/removed in-situ or in a dedicated processing chamber using an ashing process or any other suitable technique.

In step 406, the substrate is subjected to a k-restoration process, such as a silylation process, in-situ or within a separated processing chamber. In one embodiment, the k-restoration process is performed in a separated UV-based processing chamber, such as the processing chamber as discussed above with respective to FIGS. 1 and 2. The silylation process may be used to recover or repair at least some of the damage to a low-k dielectric material, such as porous carbon-doped oxides. During the silylation process, the substrate is exposed to a silylation agent selected from a group comprising hexamethyldisilazane (HMDS), tetramethyldisilazane (TMDS), trimethylchlorosilane (TMCS), dimethyldichlorosilane (DMDCS), methyltrichlorosilane (MTCS), trimethylmethoxysilane (TMMS), phenyltrimethoxysilane (PTMOS), phenyldimethylchlorsilane (PDMCS), dimethylaminotrimethylsilane (DMATMS), bis(dimethylamino)dimethylsilane (BDMADMS), or combinations thereof. The silylation agent may take the form of a gas or of a vaporized liquid vapor.

In one embodiment, the processing time for the vapor silylation may be from about 1 minute to about 10 minutes. The flow rate of the silyating agent may be between about 0.1 g/min to about 5 g/min and the chamber pressure may be between about 200 milliTorr and about 500 Torr. The silylation process may be performed by flowing one or more silyating agents toward the substrate through a UV transparent gas distribution showerhead from a region between a UV transparent window and the UV transparent gas distribution showerhead, for example the vacuum window 212 and the transparent showerhead 214 as discussed above with respect to FIGS. 2 and 3. During the silylation process, the substrate may be heated to a temperature of about 150° C. to about 400° C., for example between about 200° C. and about 350° C. Higher temperature has been found to assist in moisture desorption from the damage layer in the low-k dielectric layer and also improves the kinetics of the silylation reactions. Higher temperature is also believed to improve cross-linking within the repair damage layer to improve stability of the repair.

Exposing the damaged layer of the low-k dielectric layer to a vaporized silyating agent can replenish the damaged layer with carbon and/or form a passivation layer in or on the low-k dielectric layer. For example, methyl or phenyl containing silylation compounds can react with the Si—OH groups in the low-k dielectric layer to convert hydrophilic Si—OH groups into hydrophobic Si—O—Si bonds (e.g., Si—O—Si (CH$_3$)$_3$ groups or Si—O—Si(CH$_3$)$_2$—O—Si groups). As hydrophobic layers are less likely to retain moisture than hydrophilic layers, moisture cannot affect the properties of the treated low-k dielectric layer. Therefore, the k value of the low-k dielectric layer is restored (i.e., decreased).

In step 408, the substrate is optionally cured in the same processing chamber for the k-restoration process using UV energy from a UV unit disposed above the UV transparent gas distribution showerhead and the UV transparent window. In one embodiment, the UV cure temperature may be from 100° C. to about 800° C., for example about 400° C. The UV cure time may be from about 10 seconds to about 600 seconds. A UV cure gas may be flown to the processing chamber through the UV transparent gas distribution showerhead. In one embodiment, an inert cure gas, such as helium and argon, may be flown to the processing chamber at a flow rate between about 1 slm to about 27 slm.

In another embodiment, the silylation process in step 406 and UV curing in step 408 can be performed simultaneously. In such a case, the UV unit turns on/off at the same time with the silylation process. In one another embodiment, the UV cure in step 408 may be performed before silylation treatment in step 920. In yet another embodiment, the silylation in step 406 and the UV cure in step 408 can be performed alternately. For example, the UV cure may be performed to remove some water from surface/side wall. The silylation is then performed to recover surface hydrophobicity. The UV cure is then performed to further recover low-k film damage. In such a case, the silylation and the UV cure may be performed for about 15 to about 30 seconds, respectively. It is contemplated that the silylation agent flow rate, time, UV power, substrate temperature, chamber pressure of silylation and UV cure process may vary depending upon the application. If desired, the UV curing may be performed in a separated processing chamber different than the processing chamber for the silylation process.

In step 410, upon completion of the optional UV curing, the substrate is removed from the processing chamber and a post cleaning process is performed within the processing chamber to remove any unwanted deposition build-up or residues (e.g., silylation residues or carbon-based and/or silicon-based residues) from the exposed surfaces of the chamber components. The chamber components may refer to any components presented within the processing chamber that may have one or more surfaces exposed to the silylation agent or any other processing gas during the process. For example, the chamber components may include, but are not limited to the vacuum window 212, the transparent showerhead 214, the vacuum window clamp 210, the gas distribution ring 224, or the chamber walls etc. The post cleaning process may be performed in a UV-based processing chamber, such as the processing chamber as discussed above with respective to FIGS. 1 and 2, by flowing an oxygen-containing gas into the processing chamber in a manner as described above with respect to FIG. 3. The oxygen-containing gas may include, but is not limited to ozone ($O_3$) gas, oxygen ($O_2$) gas, nitrous oxide ($N_2O$), nitrogen monoxide (NO), carbon monoxide (CO), carbon dioxide ($CO_2$), or combinations thereof. In one embodiment, the oxygen-containing gas comprises ozone gas. In such a case, the post cleaning process is performed with the chamber components exposing to UV radiation to improve the efficiency of ozone degeneration. Production of the necessary ozone may be done remotely with the ozone transported to the processing chamber, generated in-situ by activating oxygen with UV light to create ozone, or accomplished by running these two schemes simultaneously.

During the post cleaning process, the UV radiation emitted from an UV unit, such as UV lamp bulbs 122 shown in FIGS. 1 and 2, breaks down the oxygen-containing gas, e.g., ozone, into molecular oxygen and reactive oxygen radicals, which oxidize/react with carbon-based residues (resulted from prior process such as the silylation process) formed on the exposed surfaces of the chamber components to produce carbon dioxide and water as the resulting products, thereby cleaning the chamber components. These resulting produces and decomposed residues are then pumped into the gas exhaust port 240 and to the pump 310 to complete the post cleaning process.

If necessary, a fluorine-containing gas may be optionally introduced into the processing chamber during, before and/or after the post cleaning process to remove silicon-based residues from the exposed surfaces of the chamber components. The fluorine-containing gas may be introduced into a remote plasma source (RPS) chamber (not shown). The radicals produced in the RPS chamber are then drawn into the processing chamber in a manner as described above with respect to FIG. 3 to enhance clean efficiency.

In order to improve the efficiency of the dissociation, additional heater such as heaters 248, 250 shown in FIG. 2 may be used to heat other components in the processing chamber such as the vacuum window clamp 210, the gas distribution ring 224, and the substrate support 124. In addition, as the chamber components were exposed to UV radiation and heated during the UV curing prior to the post cleaning process, the temperature of the chamber components is maintained at a temperature ready, or almost ready to substantially break down the ozone when it hits the chamber components. Therefore, the overall clean efficiency of the chamber components is enhanced.

In one embodiment, the oxygen-containing gas, such as ozone ($O_3$) gas, may be combined with a diluents gas such as oxygen gas or nitrogen gas. In such a case, the oxygen/oxygen mixture may be combined with hydrogen gas to increase the oxidation rate. The hydrogen gas may be essentially pure hydrogen gas or a forming gas of $H_2/N_2$ having, for example, 7% hydrogen. In another embodiment, the oxygen-containing gas may be combined with helium gas. The helium gas is used as the heat transfer fluid to assist in heating the chamber components, such as the lower part of the transparent showerhead 214, thereby promoting clean efficiency of the chamber components.

It has been observed by the inventors that the pressure in the processing chamber can be adjusted to control effective cleaning of the chamber components at different regions of the processing chamber. For example, it has been observed that the post cleaning process performed at lower pressures is particularly effective in removing residues from exposed surfaces of the chamber components that are disposed at a lower region of the processing chamber, such as the substrate support 124 (FIG. 2), while the post cleaning process performed at higher pressures is particularly effective in removing residues from exposed surfaces of the chamber components that are disposed at a higher region of the processing chamber, such as the transparent showerhead 214 or vacuum window clamp 210 (FIG. 2). Higher pressures promote diffusion of the oxygen-containing gas to exposed surfaces of the chamber components in the processing chamber. Higher pressures in the processing chamber also provide longer residence time for oxygen radicals to diffuse throughout the entire processing region in which surfaces of the chamber components are exposed. Residence time is directly related to the amount of oxygen-containing gas dissociation occurring during the UV exposure. The longer the oxygen-containing gas remains exposed to the UV radiation, the more likely the dissociation of the oxygen-containing gas will continue.

In order to obtain the overall cleanliness of the chamber components, in one embodiment of the invention the post cleaning process is performed under a pressure scheme comprising a low pressure stage and a high pressure stage. In the case where ozone is used as the oxygen-containing gas, the ozone may be introduced at a lower chamber pressure of about 500 milliTorr to about 20 Torr for about 15 seconds to about 5 minutes. Thereafter, the chamber pressure may be ramped or adjusted to a higher chamber pressure of about 30 Torr to about 200 Torr for about 15 seconds to about 5 minutes. Alternatively, the ozone may be introduced at a higher chamber pressure of about 30 Torr to about 200 Torr, followed by a lower chamber pressure of about 3 Torr to about 20 Torr. The present invention also contemplates the ozone to be introduced in a chamber pressure order of low/high/low, high/low/high, or an alternating order of low and high pressures. In either case, the total processing time may range between about 30 seconds and about 10 minutes, or longer depending upon the cleanliness of the chamber components.

In another embodiment, the ozone is introduced at a total chamber pressure of about 20 Torr or less, such as about 500 milliTorr to about 10 Torr, for about 15 seconds to about 5 minutes. In one example, the ozone is introduced at a chamber pressure of about 3 Torr for about 30 seconds to about 2 minutes. Alternatively, the ozone may be introduced at a total chamber pressure of about 20 Torr or greater, such as about 30 Torr to about 200 Torr, for about 15 seconds to about 5 minutes. In one example, the ozone is introduced at a chamber pressure of about 100 Torr for about 30 seconds to about 3 minutes.

In various embodiments discussed above, the oxygen-containing gas may be introduced into the processing chamber at the flow rate of about 1 slm and about 20 slm and at a UV intensity of the applied UV radiation of about 100 mW/cm$^2$ to about 2000 mW/cm$^2$. The total time of the post cleaning process may range between about 30 seconds and about 10 minutes. The spacing between the showerhead, for example the transparent showerhead 214 (FIG. 2), and the substrate support, for example the substrate support 124 (FIG. 2) may be between about 600 mils and about 2000 mils, for example about 1200 mils. The temperature of the processing chamber may be maintained at a temperature from about 150° C. to about 550° C., for example about 350° C. or above during the post cleaning process. The post cleaning process may be repeated until the unwanted deposition build-up is removed. Alternatively, the post cleaning process may be performed periodically at every preset time interval or when a preset number of substrates are processed. For example, the post cleaning process may be performed at a cleaning interval of about 15 substrates to about 2000 substrates, for example about 200 substrates. The actual cleaning interval x (x=1, 3, . . . , 13) may vary depending upon the cleanliness of the chamber components.

Embodiments of the invention improve the cleaning effectiveness of exposed surfaces of the chamber components, such as the vacuum window, showerhead, substrate support, and chamber walls etc., presented in the processing chamber by means of low pressure ozone clean and high pressure ozone clean. Particularly, the post cleaning process together with an optimized flow pattern effectively clean the build-up of silylation coating or residues founded at certain lower showerhead clamp area. Therefore, the UV source efficiency is enhanced.

While the foregoing is directed to embodiments of the invention, other and further embodiments of the invention may be devised without departing from the basic scope thereof.

The invention claimed is:

1. A method for cleaning a thermal processing chamber, comprising:
flowing an oxygen-containing gas through a plurality of passages formed in a UV transparent gas distribution showerhead and into a processing region located between the UV transparent gas distribution showerhead and a substrate support disposed within the thermal processing chamber;

exposing the oxygen-containing gas to UV radiation under a pressure scheme comprising a low pressure stage and a high pressure stage to generate reactive oxygen radicals, wherein the low pressure stage comprises maintaining a total chamber pressure at a range between about 500 milliTorr and about 20 Torr, and the high pressure stage comprises maintaining a total chamber pressure at a range between about 30 Torr and about 200 Torr; and removing unwanted residues or deposition build-up from exposed surfaces of chamber components presented in the thermal processing chamber using the reactive oxygen radicals.

2. The method of claim 1, wherein the low pressure stage comprises maintaining a total chamber pressure at a range between about 500 milliTorr and about 20 Torr is maintained for about 15 seconds to about 5 minutes, and the high pressure stage comprises maintaining a total chamber pressure at a range between about 30 Torr and about 200 Torr is maintained for about 15 seconds to about 5 minutes.

3. The method of claim 1, wherein the oxygen-containing gas comprises ozone ($O_3$) gas, oxygen ($O_2$) gas, nitrous oxide ($N_2O$), nitrogen monoxide (NO), carbon monoxide (CO), carbon dioxide ($CO_2$), or a combination thereof.

4. The method of claim 1, further comprising:

exposing the exposed surfaces of the chamber components to fluorine-containing radicals introduced from a remote plasma source.

5. The method of claim 1, further comprising:

flowing a helium gas with the oxygen-containing gas.

6. The method of claim 1, wherein exposing the oxygen-containing gas to the UV radiation further comprising:

maintaining a spacing between the showerhead and the substrate support at about 600 mils to about 2000 mils.

7. A method for cleaning a thermal processing chamber, comprising:

transferring a substrate out of the thermal processing chamber; introducing an oxygen-containing gas into an upper processing region of the thermal processing chamber, the upper processing region located between a transparent window and a transparent showerhead positioned within the thermal processing chamber;

flowing the oxygen-containing gas through one or more passages formed in the transparent showerhead and into a lower processing region, the lower processing region located between the transparent showerhead and a substrate support located within the thermal processing chamber;

exposing the oxygen-containing gas to a thermal radiation under a pressure scheme comprising a low pressure stage and a high pressure stage to generate reactive oxygen radicals, wherein the low pressure stage comprises maintaining a total chamber pressure at a range between about 500 milliTorr and about 20 Torr, and the high pressure stage comprises maintaining a total chamber pressure at a range between about 30 Torr and about 200 Torr; and removing unwanted residues or deposition build-up from exposed surfaces of chamber components presented in the thermal processing chamber using the reactive oxygen radicals.

8. The method of claim 7, wherein the introducing oxygen-containing gas into the upper processing region further comprises:

flowing the oxygen-containing gas radially from a gas distribution ring configured to surround a circumference of the transparent window to one or more passages formed in the transparent showerhead.

9. The method of claim 8, further comprising:

ejecting the oxygen-containing gas radially from the lower processing region into a gas outlet ring configured to surround a circumference of the transparent showerhead.

10. The method of claim 7, wherein the oxygen-containing gas comprises ozone ($O_3$) gas, oxygen ($O_2$) gas, nitrous oxide ($N_2O$), nitrogen monoxide (NO), carbon monoxide (CO), carbon dioxide ($CO_2$), or a combination thereof.

11. The method of claim 7, wherein the thermal radiation comprises ultraviolet (UV) or infrared (IR) radiation.

12. The method of claim 7, wherein the exposing the oxygen-containing gas to the thermal radiation further comprises:

heating the chamber components to a temperature of about 150° C. to about 550° C.

13. The method of claim 7, further comprising:

exposing the exposed surfaces of the chamber components to fluorine-containing radicals introduced from a remote plasma source.

14. The method of claim 7, further comprising:

flowing a helium gas with the oxygen-containing gas.

15. The method of claim 7, wherein exposing the oxygen-containing gas to the thermal radiation further comprising:

maintaining a spacing between the transparent showerhead and the substrate support at about 1000 mils to about 2000 mils.

16. A method for cleaning a thermal processing chamber, comprising:

providing a substrate on a substrate support disposed in a processing region of the thermal processing chamber, wherein the thermal processing chamber comprises:

a UV transparent gas distribution showerhead disposed above the substrate support, the UV transparent gas distribution showerhead has a plurality of passages formed in the UV transparent gas distribution showerhead;

a UV transparent window disposed above the UV transparent gas distribution showerhead; and a UV unit disposed outside the processing region, wherein the UV unit is configured to direct a UV radiation towards the substrate support through the UV transparent window and the UV transparent gas distribution showerhead;

chemically treating the substrate by flowing one or more processing gases into the processing region through the plurality of passages formed in the UV transparent gas distribution showerhead;

curing the substrate by directing the UV radiation towards the substrate from the UV unit through the UV transparent gas distribution showerhead and the UV transparent window;

transferring the substrate out of the thermal processing chamber;

flowing an oxygen-containing gas through the plurality of passages formed in the UV transparent gas distribution showerhead and into the processing region;

exposing the oxygen-containing gas to the UV radiation from the UV unit under a pressure scheme comprising a low pressure stage and a high pressure stage to generate reactive oxygen radicals, wherein the low pressure stage comprises maintaining a total chamber pressure at a range between about 500 milliTorr and about 20 Torr, and the high pressure stage comprises maintaining a total chamber pressure at a range between about 30 Torr and about 200 Torr; and removing unwanted residues or deposition build-up from exposed surfaces of chamber components presented in the thermal processing chamber using the reactive oxygen radicals.

* * * * *